United States Patent [19]
Fierkens

[11] Patent Number: 5,226,226
[45] Date of Patent: Jul. 13, 1993

[54] TUBE-SHAPED PACKAGE FOR A SEMICONDUCTOR DEVICE AND METHOD THEREFOR

[76] Inventor: Richard H. J. Fierkens, Keurbeck 15, 6914 AE Herwen, Netherlands

[21] Appl. No.: 883,481

[22] Filed: May 15, 1992

Related U.S. Application Data

[63] Continuation-in-part of Ser. No. 736,792, Jul. 29, 1991, Pat. No. 5,155,902.

[51] Int. Cl.$^5$ .................. H01R 43/00; B65D 73/02
[52] U.S. Cl. ..................... 29/827; 206/328; 140/105; 174/52.4; 437/217; 437/220; 257/723
[58] Field of Search .............. 29/827; 140/105; 174/52.4; 206/328, 331, 332; 357/70; 437/217, 220

[56] References Cited

U.S. PATENT DOCUMENTS 5,053,852  10/1991  Biswas et al. ............... 357/70 X
5,155,902  10/1992  Fierkens .................... 29/827

FOREIGN PATENT DOCUMENTS 59-215758  12/1984  Japan ...................... 437/217
61-232648  10/1986  Japan ...................... 357/70
2-58360     2/1990  Japan ...................... 437/220
2-140963    5/1990  Japan ...................... 357/70

Primary Examiner—Carl J. Arbes
Attorney, Agent, or Firm—Antonio R. Durando; Harry M. Weiss

[57] ABSTRACT

A tube-shaped tray that comprises adjacent compartments for semiconductor devices disposed linearly along the length of the tray. Each compartment consists of a die-shaped bottom container having a supporting structure conforming to the specified geometry of the leads in the formed semiconductor device. A film of protective and lubricating material is provided for placement on top of the device in each compartment, so that a forming tool can freely and safely cooperate with the supporting structure of the die-shaped bottom container to form the leads of the semiconductor device according to the desired specifications. The tray also includes a slidable retaining cover to prevent spillage and damage of the packaged devices. The invention also describes a process of packaging whereby the tube-shaped tray is positioned longitudinally under an off-loading machine, a semiconductor device with formable leads is off-loaded and placed in each die-shaped compartment under a forming tool, a film of protective and lubricating material is placed over each semiconductor device and under the forming tool, and the forming tool is actuated thereby forming the leads of each semiconductor device in the tray, so that the tray simultaneously provides a support and package of the semiconductor devices with bent leads according to specification. Because of the uni-directional operation of the packaging sequence, the various tools used in the process are required to function only in one direction, which results in a simpler, less expensive, and more reliable operation.

14 Claims, 2 Drawing Sheets

TUBE-SHAPED PACKAGE FOR A SEMICONDUCTOR DEVICE AND METHOD THEREFOR

RELATED APPLICATIONS

This is a continuation-in-part application of U.S. application Ser. No. 07/736,792, filed by the same inventor on Jul. 29, 1991, currently copending now U.S. Pat. No. 5,155,902, issued Oct. 20, 1992.

BACKGROUND OF THE INVENTION

1. Field of the Invention

This invention pertains to the general field of packages and packaging methods for semiconductor devices; in particular, the invention relates to a package and packaging method comprising a container with multiple die-shaped compartments for a semiconductor device having a plurality of leads, wherein the container is used both for supporting the semiconductor devices and for shaping the leads thereof to a desired configuration.

2. Description of the Prior Art

Semiconductor devices are typically provided with conductive leads extending outwardly from a core semiconductor portion. These leads often need to be bent to conform to the requirements of the printed circuit board for which they are designed, so that, for example, they can extend through via holes in the circuit board, thereby interconnecting a number of semiconductor and other devices into a desired circuit or system. The method of manufacture of semiconductor devices with leads includes the step of inserting the leads on the core semiconductor portion at a station, followed by forming the plastic encapsulation (bonding) that incorporates the leads into the semiconductor portion at another station, and packaging the semiconductor device at the assembly line's last station with the leads extending outwardly (unformed) on the same plane of the semiconductor portion of the device. If required, a totally separate operation is usually carried out to bend (pre-form) the leads to the desired configuration for a particular intended purpose prior to a subsequent and separate packaging procedure to provide both support for and packaging of the semiconductor device.

One problem with the prior art methods of bending the leads and subsequently packaging the semiconductor device with the pre-formed leads is that it involves separate steps carried out at several (and possibly separate) assembly stations, which results in relatively high labor and equipment assembly costs. Another problem is the avoidance of damage to the bent leads (which need to be kept bent in accordance with a pre-set specification) during the process of packaging the semiconductor device. This problem is addressed in U.S. Pat. No. 4,706,811 to Jung et al. and U.S. Pat. No. 4,747,017 to Koors et al. which describe a semiconductor device nested within two plastic rings that pre-form the leads of the device to a desired configuration and at the same time provide protection. The rings are snapped around the semiconductor portion of the device after bonding to the lead frame and, in the process, bend the leads to specification. While this procedure provides needed protection to the formed leads in the device, it still requires further packaging of the unit for storage and shipping. Moreover, the procedure entails a separate step in the assembly of the device.

My copending application Ser. No. 07/736,792, referenced above, is directed at providing a solution to these problems by disclosing a method of packaging whereby the leads of the semiconductor device are bent to specification at the same time that they are packaged, thus reducing the number of steps and cost of the overall manufacturing and packaging operation. Yet another problem, not addressed in that application, is that current methods of packaging load the semiconductor devices on trays (blister magazines) having multiple adjacent compartments in both directions (X-Y trays). The geometry of these trays requires the off-loading equipment to operate in two directions, which greatly complicates the equipment with attendant greater costs of manufacture and greater maintenance problems. Therefore, there still exists a need for an improved semiconductor packaging tray and corresponding off-loading equipment that result in a simpler and more reliable packaging operation.

BRIEF SUMMARY OF THE INVENTION

One objective of the present invention is to provide an improved package for a multiplicity of semiconductor devices and a corresponding new packaging method that result in fewer operations during the assembly and packaging of the devices.

Another objective of the invention is to provide a package and packaging method that can be used in conjunction with the forming and shaping of the device's leads, as described in the copending application.

A further objective of the invention is to provide a package and method that increase the quality control of the assembly operation and reduce its overall cost.

Still another goal of the invention is the ability to apply the same general concept in a variety of designs and physical embodiments to fit the various packages and packaging methods currently known in the art.

A final objective of this invention is the realization of the above mentioned goals in an economical and commercially viable manner. In accordance with these and other objectives, the present invention consists of a tube-shaped tray comprising adjacent compartments for semiconductor devices disposed linearly along the length of the tray. Each compartment consists of a die-shaped bottom container having a supporting structure conforming to the specified geometry of the leads in the formed semiconductor device. A film sheet of protective and lubricating material is provided for placement on top of the device in each compartment, so that a forming tool can freely and safely cooperate with the supporting structure of the die-shaped bottom container to form the leads of the semiconductor device according to the desired specifications. The tray also includes a slidable retaining cover to prevent spillage and damage of the packaged devices. The invention also describes a process for packaging whereby the tube-shaped tray is positioned longitudinally under an off-loading machine, a semiconductor device with formable leads is off-loaded and placed in each die-shaped compartment under a forming tool, a film sheet of protective and lubricating material is placed over each semiconductor device and under the forming tool, and the forming tool is actuated thereby forming the leads of each semiconductor device int he tray, so that the tray simultaneously provides a support and package for the semiconductor devices with bent leads according to specification. Because of the uni-directional operation of the packaging sequence, the various tools used in the process are required to function only in one direction, which results in a simpler, less expensive, and more reliable operation.

Various other purposes and advantages of the invention will become clear from its description in the specification that follows, and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description discloses but one of the various ways in which the invention may be practiced.

DETAILED DESCRIPTION OF THE INVENTION

The gist of this invention lies in the linear configuration of the tray used for packaging semiconductor devices and in the supporting structure that conforms to the shape of the formed leads of each device. Thus, a more functional package and a more streamlined packaging operation result.

Figure 1:
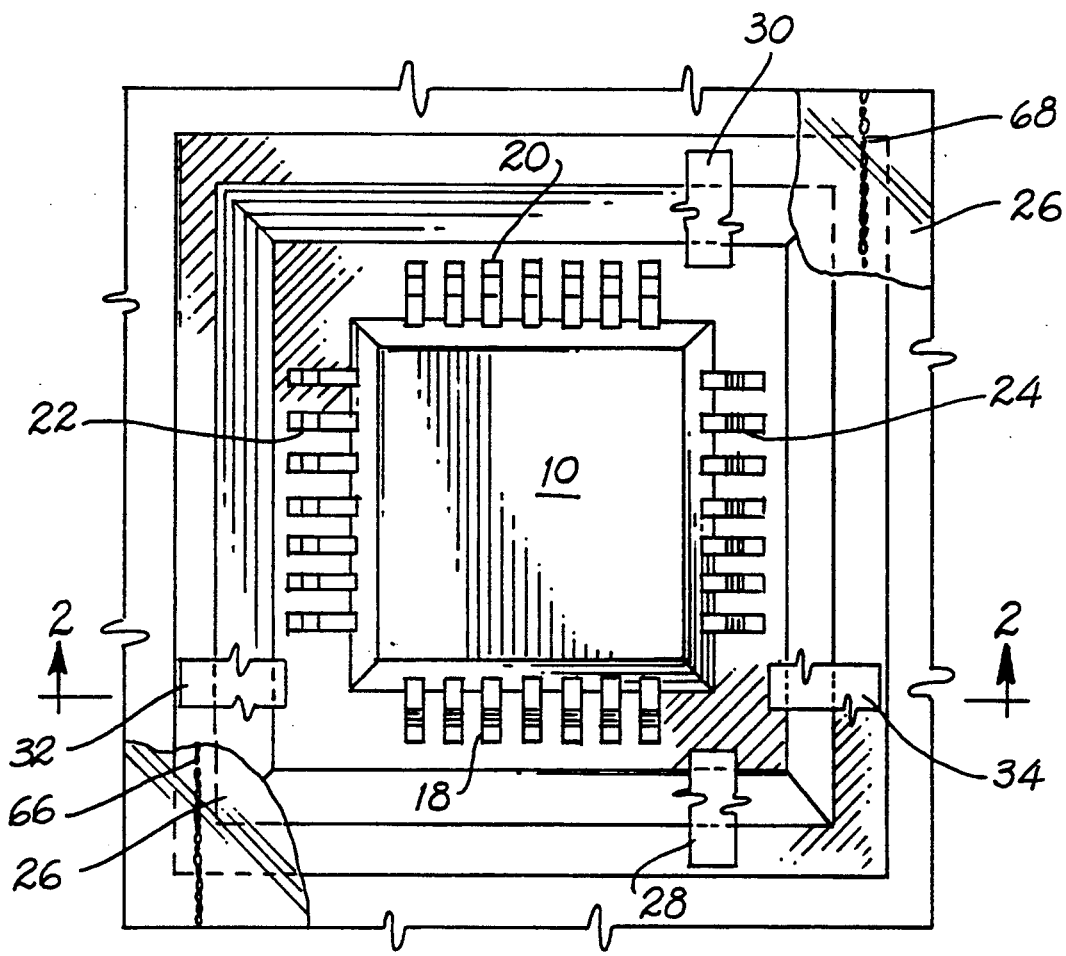
FIG. 1 is a plan or top view of a semiconductor device according to the present invention showing leads extending from the four sides of the semiconductor device.

Referring to the drawings, wherein like parts are designated throughout with like numerals and symbols, FIG. 1 illustrates a typical semiconductor device 10 with four sets of leads on each of the four sides of the device. Although described herein with reference to the semiconductor device 10, the method and package of this invention can also be implemented with a semiconductor device having a different lead configuration, such as, for example, the ones having only two sets of leads (Dual-In-Line or DIP package).

Figure 2:
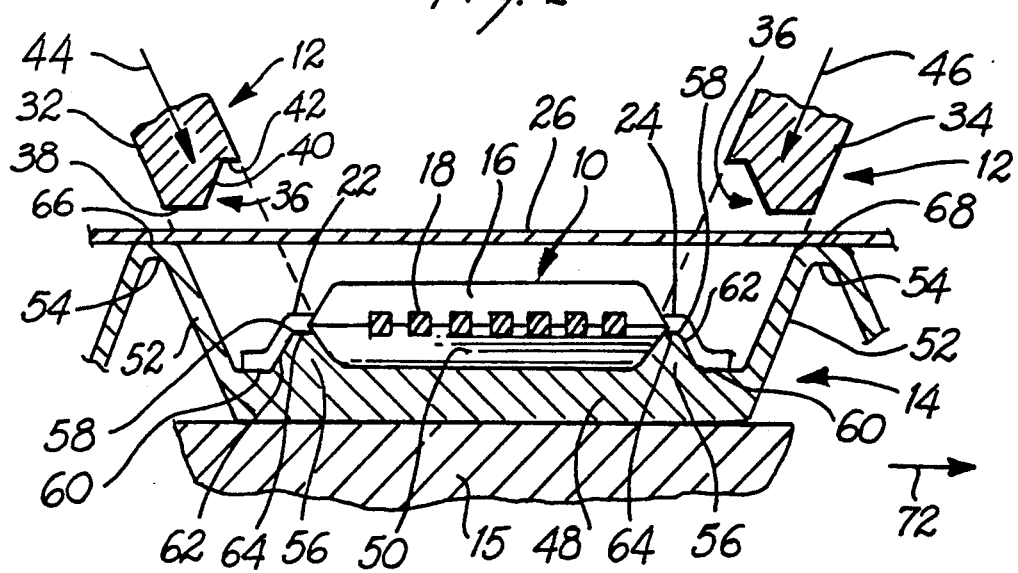
FIG. 2 is a cross-sectional view taken along line 2—2 of FIG. 1.

As disclosed in the companion application referenced above, the device 10 is supported by a preferably plastic die unit or anvil or blister pack unit 14 (seen in FIG. 2), which constitutes the bottom portion of the compartment into which the device is packaged. The device 10 consists of a semiconductor portion or unit 16 with a plurality of front leads 18, a plurality of rear leads 20, a plurality of left leads 22, and a plurality of right leads 24. As illustrated in FIG. 2, once the device 10 is placed on a corresponding die unit 14, each set of leads of the device is aligned with a coaxial punch unit 12 disposed at the last station of an assembly line used to manufacture semiconductor devices with bent leads. For the device 10 of FIG. 1, four punches of punch unit 12 are used, one for each of the four sets of leads extending from the four sides of the device. Leads 18, 20, 22, and 24 are shaped into the desired bent-lead configuration (as shown in FIG. 2 for illustration) by compression between the punch unit 12 and the supporting die unit 14 as a result of the downward movement of the punch unit 12, as more fully described below. The shape of the pre-formed leads (after the bending operation has occurred) permits the Quad-pack device (that is, the device 10 with four sides of bent leads) to be surface mounted on a printed circuit board. The leads 18, 20, 22, and 24 are typically already solder-plated before forming and packaging (as by lead-tin plating).

A lubricating film sheet or anti-friction plastic foil 26 (shown in FIG. 2) is placed over the semiconductor device 10 and is used to reduce friction between the punch unit 12 and die unit 14 during the punch-die combined process or method to shape the leads 22 and 24, as shown in FIG. 2. The die unit 14 and foil 26 are preferable made of plastic, with the plastic foil 26 being made of a thin, flexible plastic material to avoid damage to the leads of the semiconductor device during the lead pre-forming operation, and the die unit 14 being preferable made of a harder blister-pack type of plastic. Thus, the plastic film sheet 26 serves as a thin lubricating barrier to the punch unit 12 during the lead bending process in order to avoid damage to the leads and, additionally, it serves to keep the punch unit 12 clean of any solder (lead-tin solder) that might otherwise come off the solder plated leads and contaminate the punch unit.

The punch unit 12 includes a front punch 28 for bending the row of leads 18, a rear punch 30 for bending the row of leads 20, a left punch 32 for bending the row of leads 22, and a right punch 34 for bending the row of leads 24 (only a portion of punches 28, 30, 32 and 34 are shown in FIG. 1). The punch unit 12 (which includes punches 28, 30, 32, and 34) operates on and contacts a top surface portion of the foil 26 during the bent-lead forming operation. The left punch 32 (seen in FIG. 2), which is identical in structure and operation to punches 28, 30, and 34, has a bearing face 36, which has three surfaces 38, 40, and 42 for shaping the left leads 22. The left punch 32 applies a downward force 44 on the left leads 22 during the bending thereof. The right punch 34, like the left punch, simultaneously applies a downward force 46 on the right leads 24. The punch unit 12 also has an upper portion (not shown in the figures) for simultaneously actuating and guiding punches 28, 30, 32, and 34 so that the four sets of leads 18, 20, 22, and 24 are bent simultaneously. The punches 28, 30, 32, and 34 of the punch unit 12 can either be separate units that are actuated simultaneously or, if desired, they can be integrated or connected together as a one-piece unit.

The die unit 14 has a base portion 48, which has a selectively shaped upper surface 50 that is used to support the bottom of the device 10. The base 48 has a frame-shaped or four-sided inclined edge wall 52 (only two of which are seen in FIG. 2), which has a four-sided flat top portion 54 (only two of which are also shown in FIG. 2). The upper surface 50 has a four-sided protrusion or projection 56 (only two are seen in FIG. 2) each of which has an upper bearing face or surface 58. Each face or surface 58 has three die type surface portions 60, 62, and 64 which are respectively disposed opposite to the surfaces 38, 40, and 42 of each of the punches 28, 30, 32, and 34 to permit bending of the leads. Thus, leads 18, 20, 22, and 24 are bent to conform to the shape provided by the surfaces 38, 40, and 42 of each punch 28, 30, 32, and 34 and by the corresponding surface portions 60, 62, and 64 of the die unit 14.

In the concurrent or simultaneous lead-forming and semiconductor-packaging operational step, leads 18, 20, 22, and 24 are formed or bent by means of the respective punches 28, 30, 32, and 34 cooperating with the four protrusions 56; and the semiconductor device 10 is packaged for shipping purposes using the underlying and supporting die unit or tray 14. If desired, the film sheet or foil 26 is provided with perforations 66 and 68 (shown partially in FIG. 1) for ease of separation of portions thereof to facilitate discarding of the film sheet after its use in the lead bending (pre-forming) operation. After this operational step, the semiconductor device 10 housed in its underlying die unit or tray 14 is preferably moved in a direction 72 to an off-loading station (not shown). Thus, the bending of leads 18, 20, 22, and 24 and the simultaneously packaging of the device 10 into the bottom portion of the blister pack unit 14 are achieved prior to off-loading the entire package at a last station in the production line.

Figure 3:
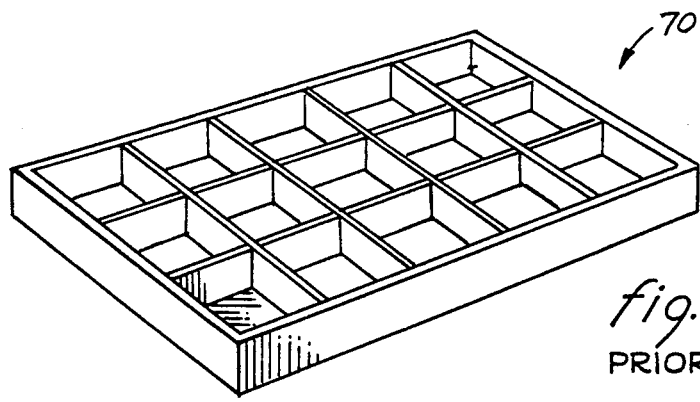
FIG. 3 is a perspective view of a typical tray used in prior art for packaging semiconductor devices in X-Y planar configuration.
Figure 4:
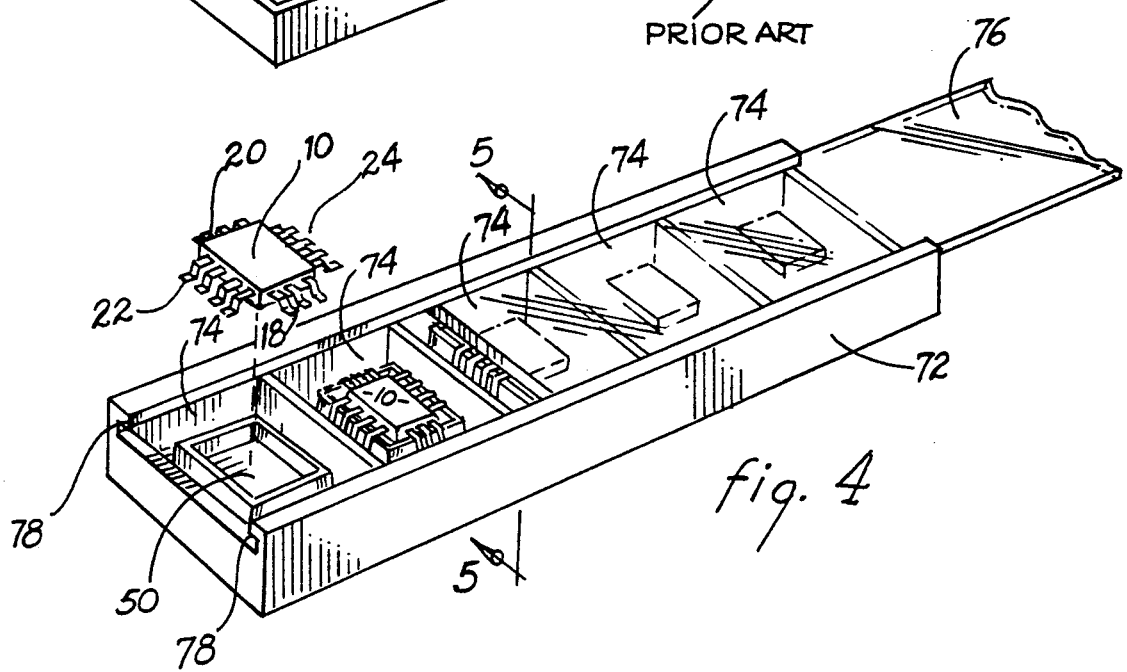
FIG. 4 is a perspective view of a the tube-shaped tray of this invention for packaging semiconductor devices in X linear configuration.

Prior art packaging is carried out in multiple-compartment magazines capable of housing individual devices in matrices of rows and columns (X-Y trays), as illustrated in the blister magazine 70 shown in FIG. 3. As mentioned above, the matrix configuration of these trays requires the tools of the assembly line to operate in two directions, thereby performing each task in both the X and Y directions to load, form and package a semiconductor device in each compartment of the tray. As a result of this requirement for two-directional functionality, the equipment is more sophisticated and expensive than corresponding equipment capable of working only in one direction. The greater cost is reflected not only in the initial capital investment, but also in the greater maintenance and greater quality control costs that are always associated with more complicated equipment. Therefore, as illustrated in FIG. 4, the embodiment of this invention that is preferred at this time consists of a blister pack unit 72 comprising multiple device compartments adjacent to one another in a single direction (X or tube-like tray), so as to receive and house a single row of semiconductor devices 10. Each compartment 74 comprises the structure and features described above for shaping the leads to specification during the process of packaging the devices in the manner herein illustrated. By virtue of its linear configuration, though, the pack unit 72 permits the use of assembly line tools that only operate in one direction, thus avoiding the cost and complication of two-directional operation. As a further feature, the preferred embodiment 72 includes a preferably transparent cover 76 capable of sliding into apposite longitudinal grooves 78 in the top portion of the pack unit 72, so that the semiconductor package can be covered for protection during shipping. The cover 76 could be slided into the grooves 78 of the pack unit 72 during the last step in the packaging operation.

Figure 5:
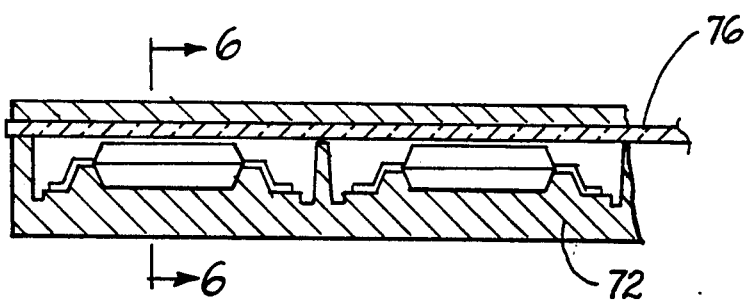
FIG. 5 is a cross-sectional view taken along line 5—5 in FIG. 4.
Figure 6:
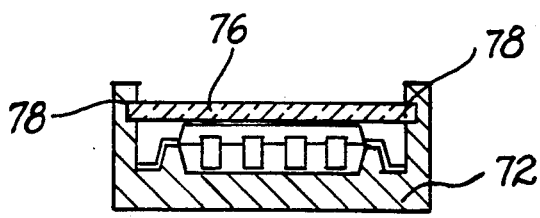
FIG. 6 is a cross-sectional view taken along line 6—6 in FIG. 5.

Thus, the packaging of semiconductor devices 10 according to the preferred apparatus and method of this invention involves the steps indicated hereafter. A packaging tray 72, comprising multiple die-shaped compartments 74 disposed in a row, is positioned longitudinally under a punch unit 12. A semiconductor device 10, having a semiconductor unit 16 which has formable leads 18, 20, 22, and 24, is placed (after the solder plating thereof) in each compartment 74 of the tray 72. An anti friction, preferably plastic, film sheet 26 is placed above each semiconductor device 10 and under the punch unit 12. The punch unit 12 is then actuated thereby bending and pre-forming the leads 18, 20, 22, and 24 of each device. A cover 76 is then slided into receiving grooves 78 in the top portion of the pack unit to enclose it and form a package. Finally, the entire packaged unit (the multiple devices 10 enclosed in the pack unit 72) is subsequently off-loaded for shipping purposes. FIGS. 5 and 6 illustrate Quad-pack devices 10 packaged in a row according to the method just described.

The following advantages characterize the combined blister pack/multiple device arrangement of this invention:

a. The leads of each semiconductor device can be shaped and formed during the packaging process because the packaging trays also serve as an anvil for bending the leads to the desired form, thus avoiding the separate step of lead forming.

b. Damage to the leads is decreased by the single-step method of forming them and packaging the semiconductor device.

c. Sequential, less expensive and simpler uni-directional equipment can be used because of the row configuration of the pack unit (tube-shaped tray), thus decreasing capital and maintenance costs.

d. Quality control costs are decreased as a result of the simpler, uni-directional, sequential packaging format and procedure.

e. Labor costs for packaging each semiconductor device are decreased because of the fewer steps involved by the concurrent lead pre-forming and device packaging.

f. The speed of packaging is increased by the fewer steps required and the cost of manufacture of a packaged semiconductor device is correspondingly decreased, as compared to the semiconductor devices packaged according to the methods and trays used in the prior art.

While this invention has been described in its preferred embodiment, it is understood that the words that have been used are words of description rather than limitation. Therefore, various changes in the details, steps and materials that have been described may be made by those skilled in the art within the principles and scope of the invention herein illustrated and defined in the appended claims. It is recognized that departures can be made from the preferred embodiment within the scope of the invention, which is therefore not to be limited to the details disclosed herein, but is to be accorded the full scope of the claims, so as to embrace any and all equivalent apparatus and methods.

I claim:

1. A method for packaging a plurality of semiconductor devices, each consisting of a semiconductor portion with multiple straight leads, in a tube-shaped tray and concurrently pre-forming the leads to a desired specification, comprising the following steps:

(a) providing a tube-shaped tray consisting of multiple adjacent compartments, each having a die-shaped base portion conforming to the bottom of a semiconductor device and containing protrusions corresponding to the shape specified for the leads of the device;

(b) placing a semiconductor device in each of said multiple adjacent compartments of the tube-shaped tray, so that the semiconductor portion of the device is supported by said die-shaped base portion of the compartment; and (c) bending the multiple straight leads of each semiconductor device by using a punch unit to shape the leads into the configuration of said protrusions in the compartment.

2. The method described in claim 1, further comprising the step of placing a protective anti-friction film sheet above each semiconductor device in said multiple adjacent compartments an under the punch unit prior to the lead bending step.

3. The method described in claim 2, wherein said protective anti-friction film sheet consists of an anti-friction plastic material.

4. The method described in claim 2, including the step of removing the anti-friction film sheet after the step of bending said leads.

5. The method described in claim 1, including the step of leaving the semiconductor devices in contact with said tube-shaped tray as a package for the devices.

6. The method described in claim 5, including the step of off-loading said tube-shaped tray containing the semiconductor devices after the punch operation.

7. The method described in claim 1, including the step of covering said tube-shaped tray with a retaining cover to prevent spillage and damage of the packaged devices.

8. The method described in claim 1, wherein each step is performed sequentially on each compartment of said tube-shaped tray as it moves longitudinally along an assembly line.

9. A semiconductor package including multiple semiconductor devices with pre-formed leads, comprising:

(a) a tube-shaped tray consisting of longitudinally-positioned multiple adjacent compartments, each having a die-shaped base portion conforming to the bottom of a semiconductor device and containing protrusions corresponding to the shape specified for the leads of the device; and (b) a semiconductor device, consisting of a semiconductor portion with multiple straight leads, placed in each of said multiple adjacent compartments of the tube-shaped tray, so that the semiconductor portion of the device is supported by said die-shaped base portion of the compartment and wherein said multiple straight leads have been preformed by using a punch unit to shape the leads into the configuration of said protrusions in the compartments.

10. The package of claim 9, further comprising a protective anti-friction film sheet placed above each semiconductor device in said multiple adjacent compartments.

11. The package of claim 10, wherein said protective anti-friction film sheet consists of an anti-friction plastic material.

12. The package of claim 9, further comprising a cover placed over said tube-shaped tray to prevent spillage and damage of the packaged devices.

13. The package of claim 12, wherein said tube-shaped tray comprises longitudinal grooves capable of slidably receiving said cover.

14. The package of claim 13, wherein said cover is transparent.

* * * * *